United States Patent
Sim et al.

(10) Patent No.: US 8,710,547 B2
(45) Date of Patent: Apr. 29, 2014

(54) AVALANCHE PHOTO DIODE AND METHOD OF MANUFACTURING THE SAME

(75) Inventors: Jae-Sik Sim, Daejeon (KR); Kisoo Kim, Daejeon (KR); Bongki Mheen, Daejeon (KR); MyoungSook Oh, Daejeon (KR); Yong-Hwan Kwon, Daejeon (KR); Eun Soo Nam, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 0 days.

(21) Appl. No.: 13/605,135

(22) Filed: Sep. 6, 2012

(65) Prior Publication Data
US 2013/0153962 A1    Jun. 20, 2013

(30) Foreign Application Priority Data
Dec. 16, 2011    (KR) .................. 10-2011-0136694

(51) Int. Cl.
*H01L 29/72*    (2006.01)
(52) U.S. Cl.
USPC ..... 257/186; 257/361; 257/432; 257/E31.064
(58) Field of Classification Search
USPC ......................... 257/186, 351, 432, E31.064
See application file for complete search history.

(56) References Cited

U.S. PATENT DOCUMENTS

2009/0065704 A1*   3/2009   Heringa et al. .......... 250/370.11

FOREIGN PATENT DOCUMENTS

| KR | 10-2000-0024447 | * | 5/2000 |
| KR | 10-0303471 B1 | | 7/2001 |
| KR | 10-2004-0032026 A | | 4/2004 |
| KR | 10-0837808 B1 | | 6/2008 |

OTHER PUBLICATIONS

Kyung-Sook Hyun et al., "Pre-breakdown suppression in planar InP/InGaAs avalanche photodiode using deep floating guard ring", Applied Physics Letters, Dec. 6, 2004, pp. 5547-5549, vol. 85, No. 23.
K. H. Yoon et al., "Edge Breakdown Suppression of 10 Gbps Avalanche Photodiode", Journal of the Korean Physical Society, Dec. 2004, pp. S936-S940, vol. 45.
J. N. Haralson II et al., "Numerical Simulation of Avalanche Breakdown within InP-InGaAs SAGCM Standoff Avalanche Photodiodes", Journal of Lightwave Technology, Nov. 1997, vol. 15, No. 11.

* cited by examiner

*Primary Examiner* — Edward Wojciechowicz
(74) *Attorney, Agent, or Firm* — Rabin & Berdo, P.C.

(57) ABSTRACT

The inventive concept provides avalanche photo diodes and methods of manufacturing the same. The avalanche photo diode may include a substrate, a light absorption layer formed on the substrate, a clad layer formed on the light absorption layer, an active region formed in the clad layer, a guard ring region formed around the active region, and an insulating region formed between the guard ring region and the active region.

13 Claims, 7 Drawing Sheets

AVALANCHE PHOTO DIODE AND METHOD OF MANUFACTURING THE SAME

CROSS-REFERENCE TO RELATED APPLICATIONS

This U.S. non-provisional patent application claims priority under 35 U.S.C. §119 to Korean Patent Application No. 10-2011-0136694, filed on Dec. 16, 2011, the entirety of which is incorporated by reference herein.

BACKGROUND

The inventive concept relates to photo diodes and methods of manufacturing the same and, more particularly, to avalanche photo diodes and methods of manufacturing the same Recently, as optical communication systems and image processing systems of high speed and mass capacity have been increasingly demanded, various researches have been conducted for photo detectors essentially used therein.

The photo detectors may detect light reflected or scattered from an object after the light is irradiated to the object. The reflected or scattered light may be condensed by a spherical lens and then be detected in the photo detectors. The light incident on the photo detector may be converted into an electric signal by a photo diode and then be transmitted to a photo receiver through an amplifier. The photo diodes may be categorized into one of a PIN (p-type intrinsic n-type) photo diode and an avalanche photo diode (APD). The PIN photo diode may have no internal gain, such that sensitivity of the PIN photo diode may be poor.

The avalanche photo diode may have more receiving sensitivity than the PIN photo diode. However, the avalanche photo diode may have a complex structure. The avalanche photo diode may have to be designed in planar type for securing reliability thereof. Limitation of the planar structure may cause badness of the avalanche photo diode. For example, edge breakdown may be caused by curvature of an active region in the avalanche photo diode. The edge breakdown may be partially suppressed by a guard ring region surrounding the active region.

However, in a conventional avalanche photo diode, the edge breakdown may not decrease by a dark current caused along a surface of a clad layer between the guard ring region and the active region.

SUMMARY

Embodiments of the inventive concept may provide avalanche photo diodes capable of reducing or minimizing a dark current and methods of manufacturing the same.

Embodiments of the inventive concept may also provide avalanche photo diodes capable of increasing or maximizing receiving sensitivity by suppressing edge breakdown and methods of manufacturing the same.

In one aspect, an avalanche photo diode may include: a substrate; a light absorption layer formed on the substrate; a clad layer formed on the light absorption layer; an active region formed in the clad layer; a guard ring region formed around the active region; and an insulating region formed between the guard ring region and the active region.

In some embodiments, the insulating region may include a gapfill layer filling a trench formed in the clad layer between the guard ring region and the active region.

In other embodiments, the gapfill layer may have a depth substantially equal to a depth of the guard ring region in the clad layer.

In still other embodiments, the gapfill layer may include a silicon nitride layer.

In yet other embodiments, the avalanche photo diode may further include: a passivation layer covering the gapfill layer and the guard ring region.

In yet still other embodiments, the passivation layer may include the same silicon nitride layer as the gapfill layer.

In yet still other embodiments, the active region and the guard ring region may be doped impurities of the same conductivity type.

In yet still other embodiments, the avalanche photo diode may further include: a top electrode formed on the active region; and a bottom electrode disposed on a back side of the substrate to expose a portion of the back side opposite to the top electrode.

In yet still other embodiments, the avalanche photo diode may further include: a grading layer formed between the light absorption layer and the clad layer; and a buffer layer formed between the grading layer and the clad layer.

In yet still other embodiments, the substrate, the buffer layer, and the clad layer may include indium-phosphorus; and the grading layer and the light absorption layer may include indium-gallium-arsenic-phosphorus.

In yet still other embodiments, the substrate, the light absorption layer, and the clad layer may be doped with impurities of a first conductivity type; and the active region and the guard ring region may be doped with impurities of a second conductivity type.

In yet still other embodiments, a center portion of the active region may have a thickness greater than that of an edge portion of the active region adjacent to the insulating region.

In another aspect, a method of manufacturing an avalanche photo diode may include: forming a light absorption layer and a clad layer on a substrate; forming an active region and a guard ring region in the clad layer; and forming an insulating region in the clad layer between the active region and the guard ring region.

In some embodiments, forming the insulating region may include: forming a trench in the clad layer between the active region and the guard ring region; and filling an insulating layer in the trench.

In other embodiments, filling the insulating layer may include: forming a passivation layer on the active region and the guard ring region.

In still other embodiments, forming the active region and the guard ring region may include: sequentially stacking a diffusion control layer and a dummy protection layer on the clad layer; removing portions of the dummy protection layer, the diffusion control layer, and the clad layer to form a recess; forming diffusion patterns in the recess and on the dummy protection layer spaced apart from the recess; and forming the active region and the guard ring region in the clad layer under the diffusion patterns.

In yet other embodiments, the active region and the guard ring region may be formed by performing a thermal treatment process on the diffusion patterns.

In yet still other embodiments, the method may further include: forming a dummy capping layer on the diffusion patterns.

In yet still other embodiments, the method may further include: forming a grading layer and a buffer layer between the light absorption layer and the clad layer.

In yet still other embodiments, each of the grading layer, the buffer layer, and the clad layer may be formed by a metal-organic chemical vapor deposition (MOCVD) process or a molecular beam epitaxy (MBE) process.

BRIEF DESCRIPTION OF THE DRAWINGS

The inventive concept will become more apparent in view of the attached drawings and accompanying detailed description.

DETAILED DESCRIPTION OF THE EMBODIMENTS

The inventive concept will now be described more fully hereinafter with reference to the accompanying drawings, in which exemplary embodiments of the inventive concept are shown. The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose the inventive concept and let those skilled in the art know the category of the inventive concept. In the drawings, embodiments of the inventive concept are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

Additionally, the embodiment in the detailed description will be described with sectional views as ideal exemplary views of the inventive concept. Accordingly, shapes of the exemplary views may be modified according to manufacturing techniques and/or allowable errors. Therefore, the embodiments of the inventive concept are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the inventive concept.

It will be also understood that although the terms first, second, third etc. may be used herein to describe various elements, these elements should not be limited by these terms. These terms are only used to distinguish one element from another element. Thus, a first element in some embodiments could be termed a second element in other embodiments without departing from the teachings of the present invention. Exemplary embodiments of aspects of the present inventive concept explained and illustrated herein include their complementary counterparts. The same reference numerals or the same reference designators denote the same elements throughout the specification.

Moreover, exemplary embodiments are described herein with reference to cross-sectional illustrations and/or plane illustrations that are idealized exemplary illustrations. Accordingly, variations from the shapes of the illustrations as a result, for example, of manufacturing techniques and/or tolerances, are to be expected. Thus, exemplary embodiments should not be construed as limited to the shapes of regions illustrated herein but are to include deviations in shapes that result, for example, from manufacturing. For example, an etching region illustrated as a rectangle will, typically, have rounded or curved features. Thus, the regions illustrated in the figures are schematic in nature and their shapes are not intended to illustrate the actual shape of a region of a device and are not intended to limit the scope of example embodiments.

Hereinafter, an avalanche photo diode according to embodiments of the inventive concept will be described with reference to the drawings.

Figure 1:
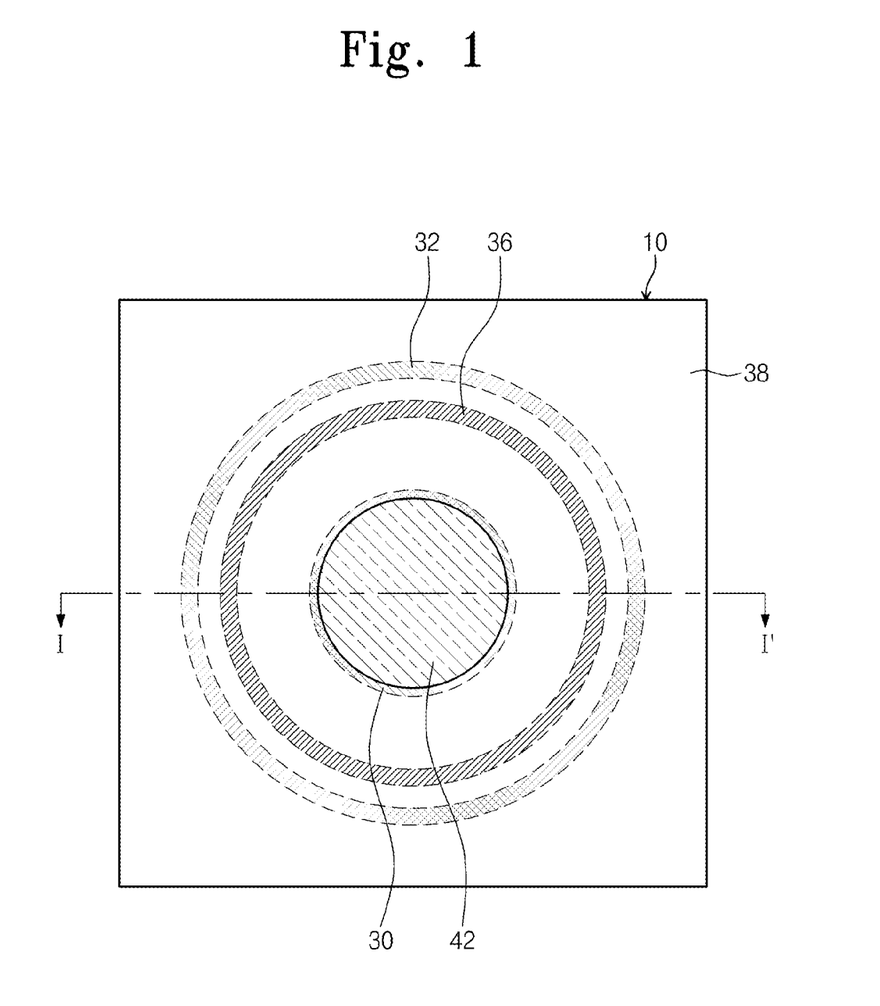
FIG. 1 is a plan view illustrating an avalanche photo diode according to embodiments of the inventive concept.
Figure 2:
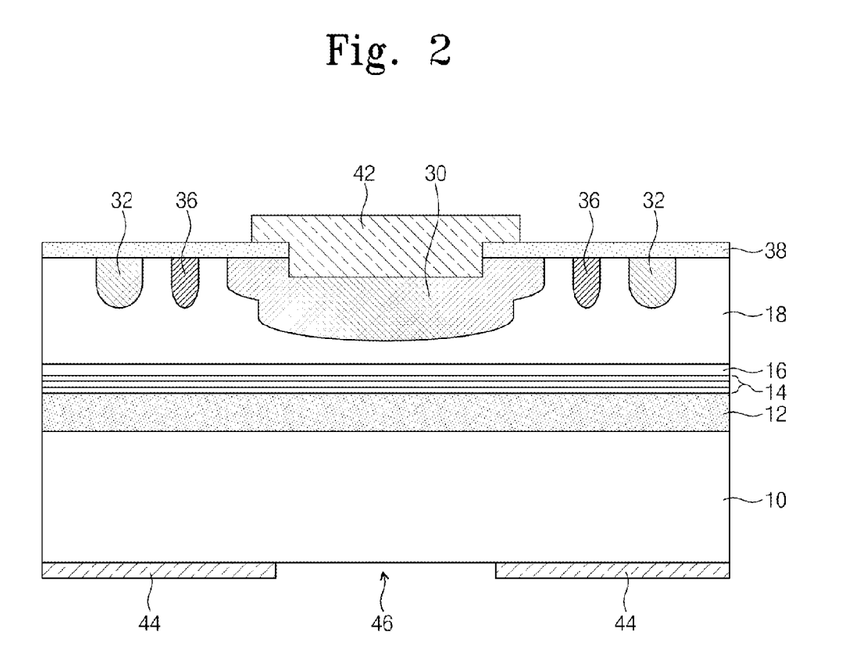
FIG. 2 is a cross-sectional view taken along a line I-I' of FIG. 1.

FIG. 1 is a plan view illustrating an avalanche photo diode according to embodiments of the inventive concept. FIG. 2 is a cross-sectional view taken along a line I-I' of FIG. 1.

Referring to FIGS. 1 and 2, an avalanche photo diode according to embodiments of the inventive concept may include an insulating region 36 between an active region 30 and a guard ring region 32. The insulating region 36 may reduce or minimize a dark current induced along a top surface of a clad layer 18 between the active region 30 and the guard ring region 32. The insulating region 36 may increase gain in the active region 30, so that edge breakdown may be suppressed.

Thus, the avalanche photo diode according to embodiments of the inventive concept may increase or maximize receiving sensitivity by suppression of the edge breakdown.

Visible light may be incident into a light absorption layer 12 through a light receiving region 46 between bottom electrodes 44 disposed on a back side of a substrate 10. Even though not shown in the drawings, the light may transmit a top electrode on a front side of the substrate 10 and then be incident into the light absorption layer 12. The substrate 10 may include single-crystalline $n^+$-InP ($n^+$-type indium-phosphorus). A bottom buffer layer (not shown), the light absorption layer 12, a grading layer 14, a buffer layer 16, the clad layer 18, and a passivation layer 38 may be sequentially stacked on the substrate 10. The light absorption layer 12 and the grading layer 14 may include n-InGaAsP (n-type indium-gallium-arsenic-phosphorus). The grading layer 14 may consist of a plurality of n-InGaAsP layers of which energy band gaps are different from each other. The substrate 10, the buffer layer 16, and the clad layer 18 may include n-InP. Here, n-type may be defined as a first conductivity type and p-type may be defined as a second conductivity type.

The p+-InP active region 30, the insulating region 36, and the guard ring region 32 may be disposed in the clad layer 18 and be arranged in concentric circles. The top electrode 42 may be in contact with the active region 30 and the bottom electrode 44 may be disposed under the substrate 10. The grading layer 14 may have at least one energy band gap between an energy band gap of the substrate 10 and an energy band gap of the light absorption layer 12. The n-InP buffer layer 16 may buffer an electric field. The n-InP buffer layer 16 may have an impurity concentration within a range of about $2.0 \times 10^{17}/cm^3$ to about $4.5 \times 10^{17}/cm^3$. The n-InP clad layer 18 may have a thickness within a range of about 3.0 µm to 4.5 µm.

The light absorption layer 12 may generate electron-hole pairs (EHP) by the visible light. Electrons and the holes of the EHPs generated from the light absorption layer 12 may be separated by a great electric field. The separated holes may be rapidly injected into the clad layer 18 through the grading layer 14, and the separated electrons may be outputted through the lower electrode 44. The holes inputted into the clad layer 18 may be accelerated by a great electric field in the clad layer 18. The accelerated holes may impact lattices to ionize atoms in the clad layer 18. Thus, additional holes are generated. In other words, the holes may be additionally generated by the great electric field of the clad layer 18, such that a light current may be amplified. Thus, the avalanche photo diode according to embodiments of the inventive concept may internally amplify the electric signal converted by the incident light. Thus, it is possible to output the electric signal of which a signal to noise ratio (SNR) is high.

As described above, the guard ring region 32 having the same conductivity type as the active region 30 may be disposed in the clad layer 18. The guard ring region 32 may have a ring-shape surrounding the active region 30 and spaced apart from the active region 30 in a plan view. The guard ring region 32 may be electrically separated from the active region 30. The guard ring region 32 may prevent avalanche breakdown phenomenon from first occurring at an edge portion of a PN junction by a focused electric field as compared with a center portion of the PN junction. The avalanche breakdown phenomenon at the edge portion may be defined as an edge breakdown. A center portion of the active region 30 may be deeper than an edge portion of the active region 30 in the clad layer 18. In other words, a thickness of the center portion of the active region 30 may be greater than a thickness of the edge portion of the active region 30.

The insulating region 36 may reduce or minimize a dark current induced along the top surface of the clad layer 18 between the active region 30 and the guard ring region 32. The insulating region 36 may include the same silicon nitride layer as the passivation layer 38. A portion of the top surface of the clad layer 18 between the active region 30 and the guard ring region 32 may be depressed by a trench (34 of FIG. 9) of the insulating region 36. The insulating region 36 may increase an effective distance of the top surface of the clad layer 18. In other words, the insulating region 36 may increase the effective distance of the clad layer 18 between the active region 30 and the guard ring region 32, such that the edge breakdown may be suppressed.

Thus, the avalanche photo diode according to embodiments may increase or maximize receiving sensitivity by suppressing the edge breakdown.

A method of manufacturing the avalanche photo diode will be described hereinafter.

FIGS. 3 to 12 are cross-sectional views taken along a line I-I' of FIG. 1 to explain a method of manufacturing an avalanche photo diode according to embodiments of the inventive concept.

Figure 3:
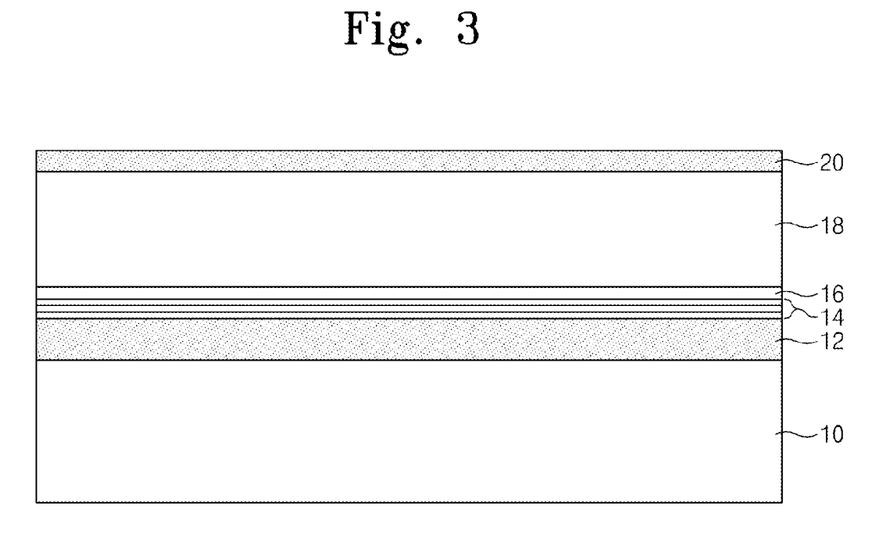
FIGS. 3 to 12 are cross-sectional views taken along a line I-I' of FIG. 1 to explain a method of manufacturing an avalanche photo diode according to embodiments of the inventive concept.

Referring to FIG. 3, a bottom buffer layer (not shown), a light absorption layer 12, a grading layer 14, a buffer layer 16, a clad layer 18, and a diffusion control layer 20 may be sequentially formed on a substrate 10. Each of the layers 12, 14, 16, 18, and 20 may be formed by a metal-organic chemical vapor deposition (MOCVD) process or a molecular beam epitaxy (MBE) process. The light absorption layer 12 may include n-InP. The grading layer 14 may include a plurality of n-InP layers having energy band gaps between the energy band gap of the grading layer 14 and the energy band gap of the light absorption layer 12. The buffer layer 16 may have an impurity concentration within a range of about $2.0 \times 10^{17}/cm^3$ to about $4.5 \times 10^{17}/cm^3$. The clad layer 18 may have a thickness within a range of about 3.0 µm to 4.5 µm.

Figure 4:
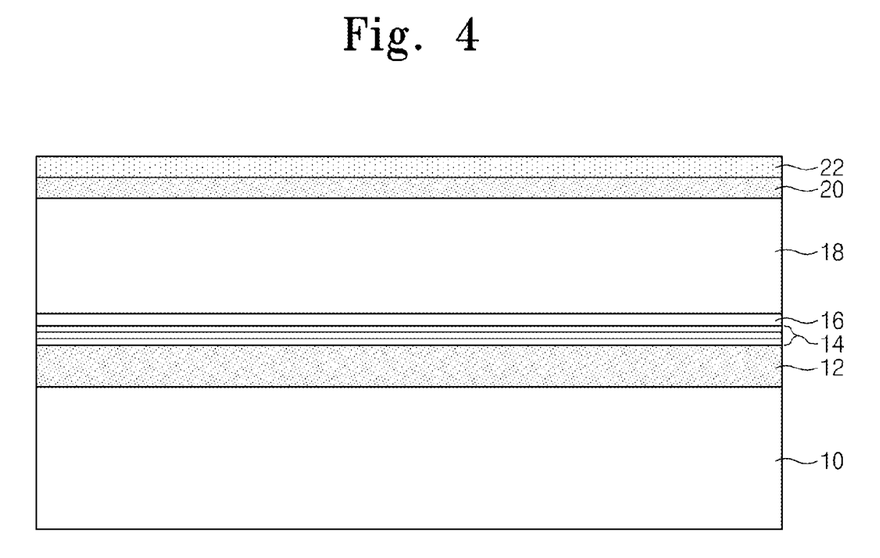

Referring to FIG. 4, a dummy protection layer 22 may be formed on the diffusion control layer 20.

The dummy protection layer 22 may include an insulating layer such as a silicon nitride ($SiN_x$) layer formed by a chemical vapor deposition (CVD) method.

Figure 5:
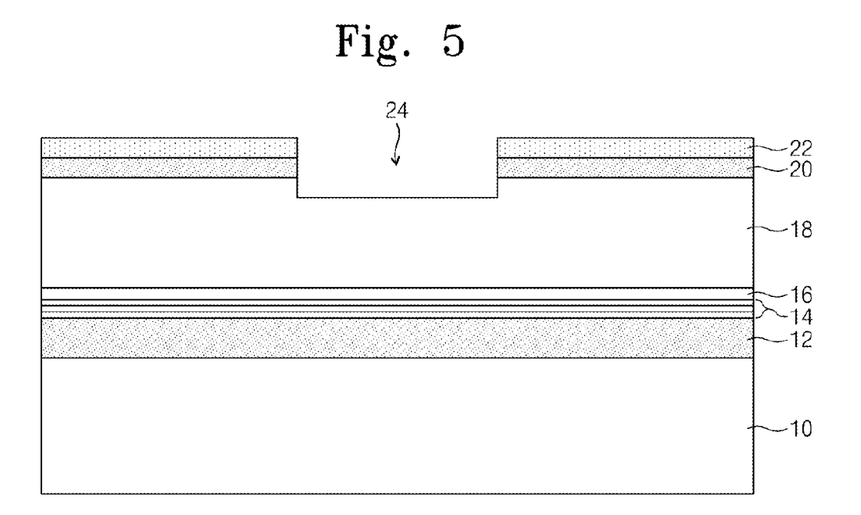

Referring to FIG. 5, the dummy protection layer 22, the diffusion control layer 20, and the clad layer 18 may be patterned to form a first recess 24. A bottom and sidewalls of the first recess 24 may expose the clad layer 18. The first recess 24 may have an etch depth within a range of about 100 nm to 500 nm from a top surface of the clad layer 18. A depth of a PN junction surface may be controlled by the depth of the first recess 24.

Figure 6:
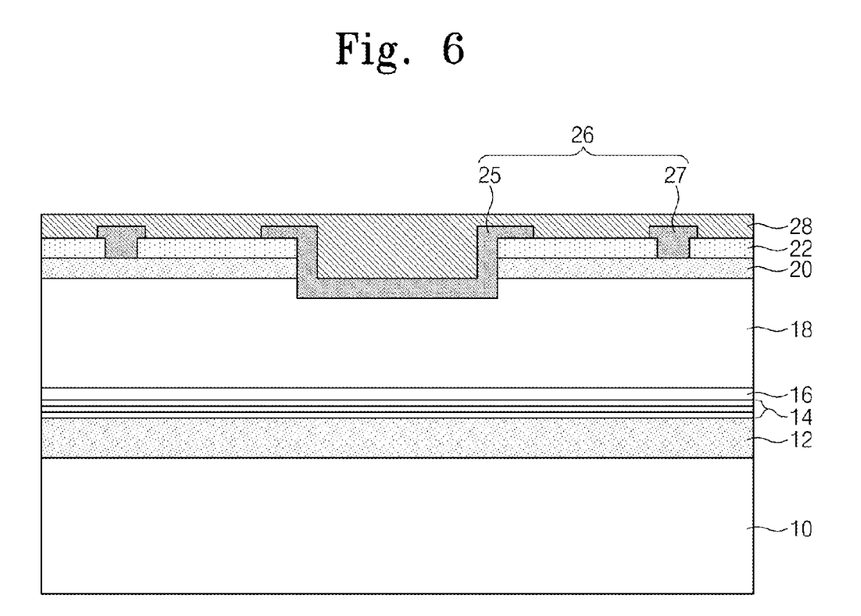

Referring to FIG. 6, diffusion patterns 26 are formed in the first recess 24 and around the first recess 24 and then a dummy capping layer 28 is formed on the diffusion patterns 26. The diffusion patterns 26 may include at least one metal of zinc (Zn) and cadmium (Cd). The diffusion patterns 26 may be formed by a metal deposition process, a photolithography process, and an etching process. For example, a first diffusion pattern 25 may be formed on the bottom and sidewalls of the first recess 24. A second diffusion pattern 27 may be formed on the dummy protection layer 22 around the first diffusion pattern 25. The second diffusion pattern 27 may penetrate the dummy protection layer 22 and then be in contact with the diffusion control layer 20. The dummy capping layer 28 may include a silicon oxide layer formed by a CVD method.

Figure 7:
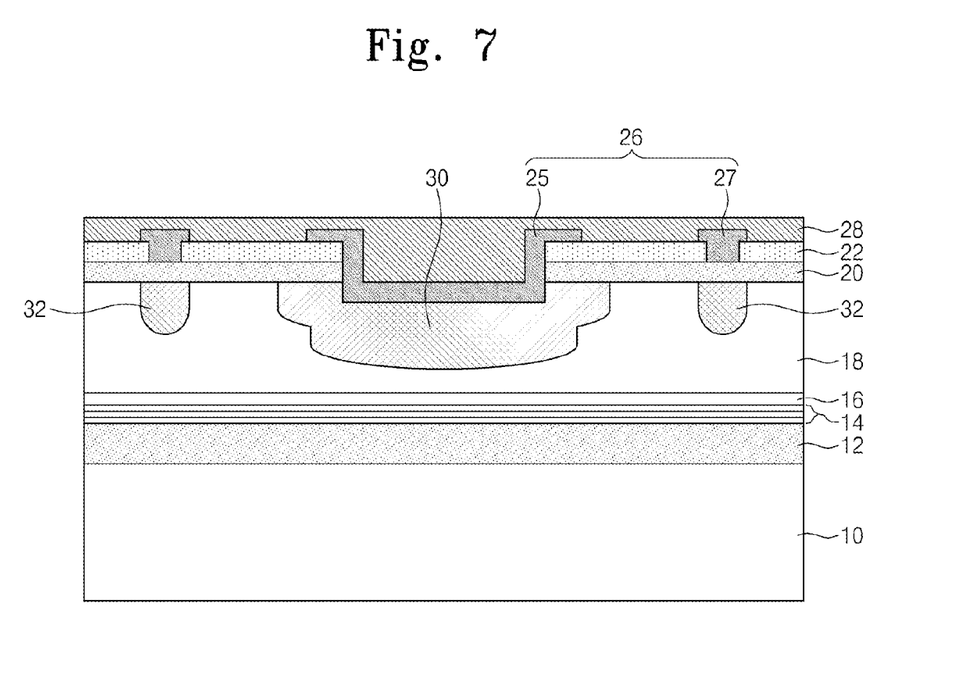

Referring to FIG. 7, metal atoms of the diffusion patterns 26 may be diffused into the clad layer 18 by a first thermal treatment process, thereby forming an active region 30 and a guard ring region 32. The first thermal treating process may be performed at a temperature within a range of about 400 degrees Celsius to about 550 degrees Celsius for a process time within a range of about 10 minutes to about 30 minutes. The metal atoms of the diffusion patterns 26 are p-type impurities and are diffused into the n-InP clad layer 18. The active region 30 may include p+-InP formed by metal atoms of the first diffusion pattern 25 diffused through the bottom and sidewalls of the first recess 24. The guard ring region 22 may be formed by diffused metal atoms of the second diffusion pattern 27. The guard ring region 22 may include p-InP. Sizes and depths of a center portion and an edge portion of the active region may be variously controlled according to a size, a thickness, a position of an impurity diffusion region for the formation of the active region 30. In some embodiments, depths of a center portion and an edge portion of the first recess 24 may be different from each other. Thus, diffusion depths of the metal atoms may be different from each other when the active region 30 is formed. The center portion of the active region 30 may be closer to the buffer layer 16 than the edge portion of the active region 30. The guard ring region 32 may be formed to have a depth substantially equal to the depth of the edge portion of the active region 30.

Figure 8:
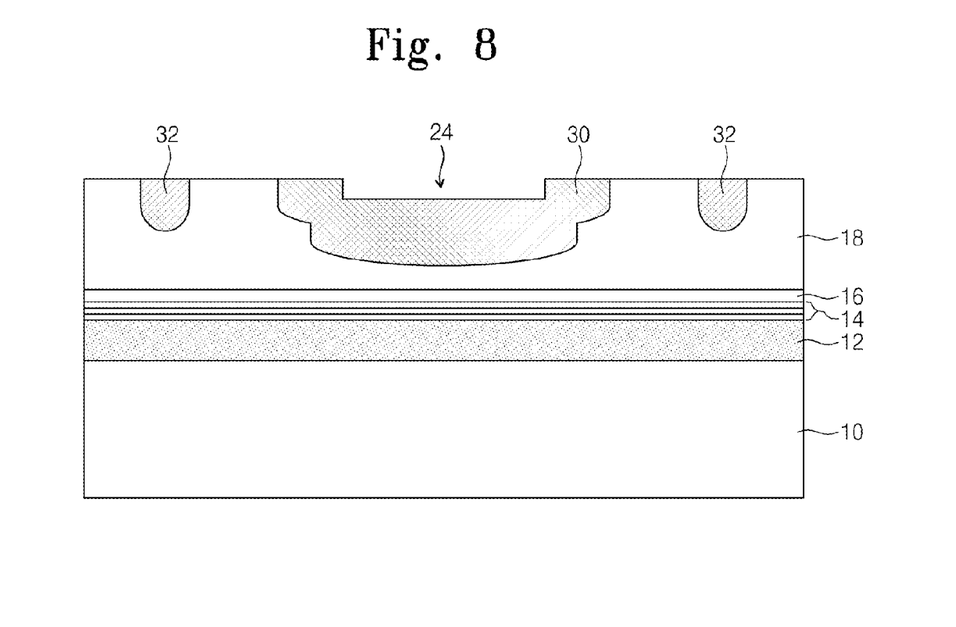

Referring to FIG. 8, the dummy capping layer 28, the diffusion patterns 26, the dummy protection layer 22, and the diffusion control layer 20 may be removed. The dummy capping layer 28, the diffusion patterns 26, the dummy protection layer 22, and the diffusion control layer 20 may be removed by a wet etching process using an acidic solution. Thereafter, a second thermal treatment process may be performed to stabilize the metal atoms in the active region 30 and the guard ring region 32. The second thermal treatment process may be performed at a temperature within a range of about 400 degrees Celsius to about 550 degrees Celsius for a process time within a range of about 10 minutes to about 30 minutes.

Figure 9:
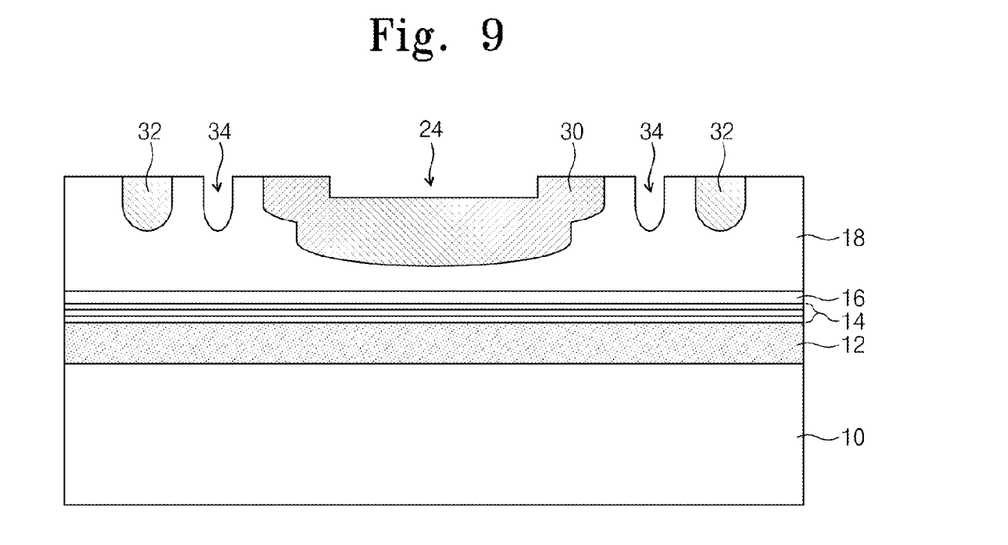

Referring to FIG. 9, a portion of the clad layer 18 between the active region 30 and the guard ring region 32 may be removed to form a trench 34. The trench 34 may be formed by a photolithography process and an etching process. The trench 34 may be formed in the clad layer 18 to have a depth substantially equal to the depth of the guard ring region 32. A bottom of the trench 34 may be formed to be rounded toward a bottom of the clad layer 18.

Figure 10:
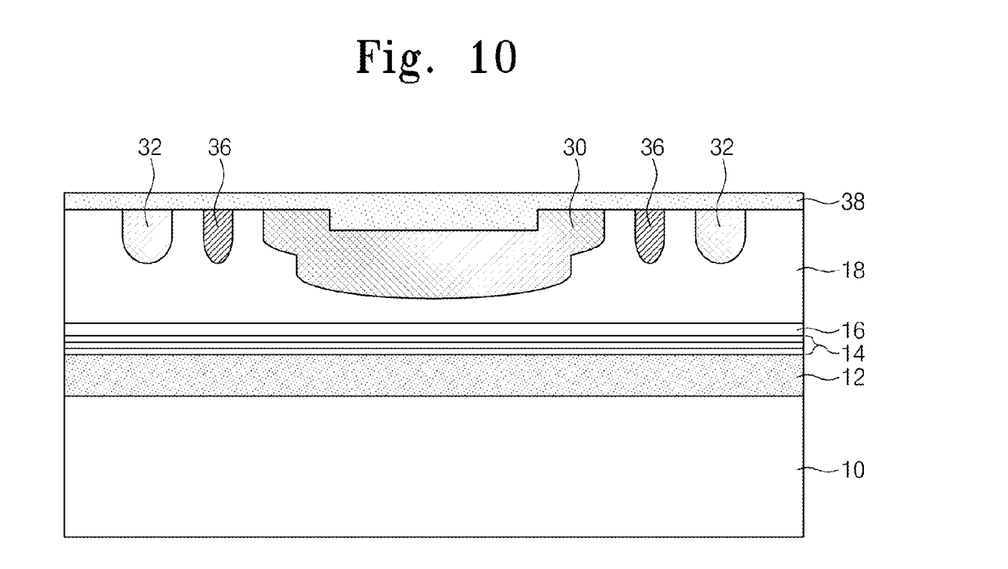

Referring to FIG. 10, a gapfill layer 36 is formed in the trench 34 and a passivation layer 38 is formed on the clad layer 18. In some embodiments, the gapfill layer 36 and the passivation layer 38 may include a silicon nitride ($SiN_x$) layer formed by a CVD method. The passivation layer 38 may be planarized by a chemical mechanical polishing (CMP) method. In other embodiments, the gapfill layer 36 and the passivation layer 38 may include a silicon oxide layer and a silicon nitride layer, respectively. A silicon oxide layer may be formed on the substrate 10 and then the silicon oxide layer may be planarized until the clad layer 18 is exposed. Thus, the gapfill layer 36 may confinedly formed in the trench 34. Next, the passivation layer 38 may be flat formed on the clad layer 18 and the gapfill layer 36. The passivation layer 38 may function as a reflection preventing layer which prevents the reflection of the light inputted from the outside of the avalanche photo diode.

Figure 11:
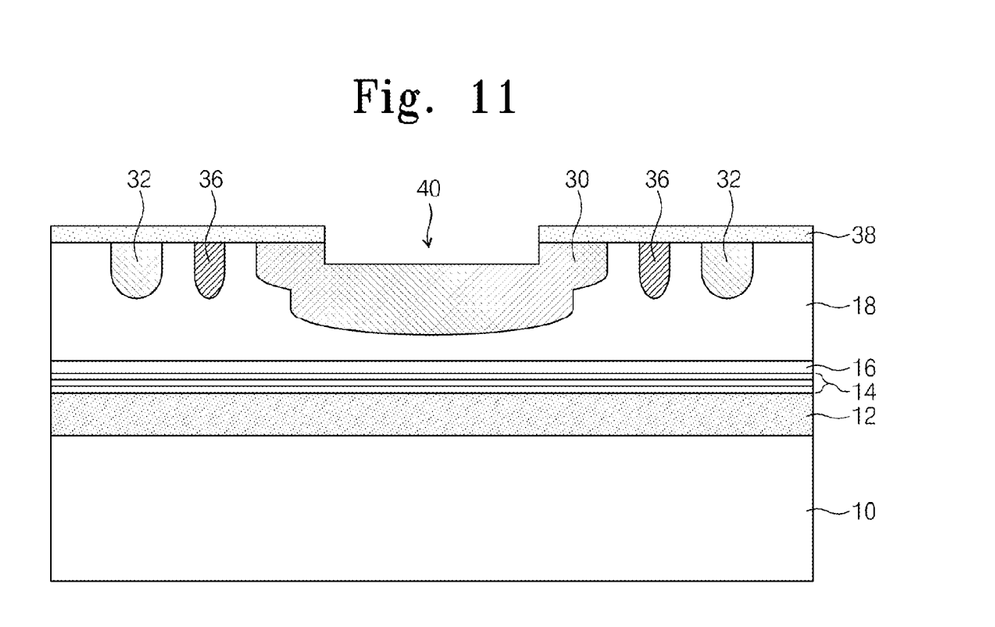

Referring to FIG. 11, the passivation layer 38 on the active region 30 is removed to form a second recess 40. The second recess 40 may be a contact region exposing the active region 30 from the passivation layer 38.

Figure 12:
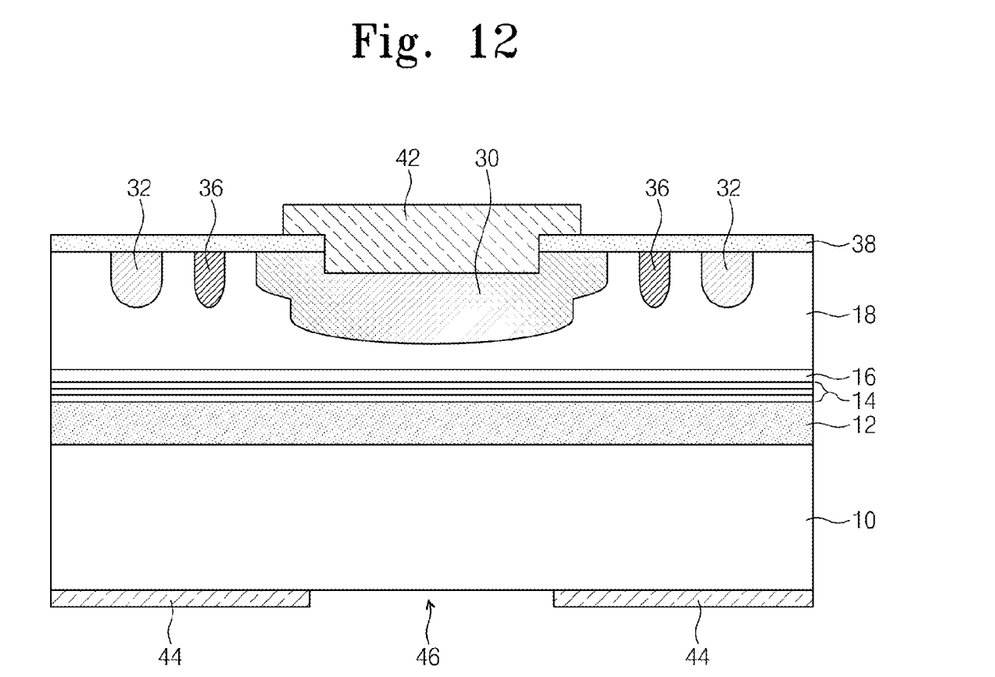

Referring to FIG. 12, a top electrode 42 is formed to be connected to the active region 30 through the second recess 40. Bottom electrodes 44 are formed to be connected to the substrate 10. The top electrode 42 and the bottom electrodes 44 may include metal such as Zn—Au alloy, Au, or Ti/Pt/Au alloy. The top electrode 42 may be formed on the active region 30 by a metal deposition process, a photolithography process, and an etching process. The bottom electrodes 44 may expose a light receiving region 46 under the active region 30 and the substrate 10.

As a result, the insulating region 36 filled with the insulating layer may be formed in the clad layer 18 between the active region 30 and the guard ring region 32 by the method of manufacturing the avalanche photo diode according to embodiments of the inventive concept.

As described above, the insulating region may be disposed in the clad layer between the active region and the guard ring region. The insulating region may reduce or minimize the dark current induced along the top surface of the clad layer between the active region and the guard ring region. Additionally, the insulating region may suppress the edge breakdown.

Thus, the avalanche photo diode may increase or maximize the receiving sensitivity.

While the inventive concept has been described with reference to example embodiments, it will be apparent to those skilled in the art that various changes and modifications may be made without departing from the spirit and scope of the inventive concept. Therefore, it should be understood that the above embodiments are not limiting, but illustrative. Thus, the scope of the inventive concept is to be determined by the broadest permissible interpretation of the following claims and their equivalents, and shall not be restricted or limited by the foregoing description.

What is claimed is:

1. An avalanche photo diode comprising:
   a substrate;
   a light absorption layer formed on the substrate;
   a clad layer formed on the light absorption layer;
   an active region formed in the clad layer;
   a guard ring region formed around the active region; and
   an insulating region formed between the guard ring region and the active region and including a trench having a predetermined depth, the insulating region reducing or minimizing a dark current induced along a top surface of a clad layer between the active region and the guard ring region, and
   a passivation layer covering the insulating layer and the guard ring region.

2. The avalanche photo diode of claim 1, wherein the insulating region includes a gapfill layer filling the trench formed in the clad layer between the guard ring region and the active region.

3. The avalanche photo diode of claim 2, wherein the gapfill layer has a depth substantially equal to a depth of the guard ring region in the clad layer.

4. The avalanche photo diode of claim 2, wherein the gapfill layer includes a silicon nitride layer.

5. The avalanche photo diode of claim 4, wherein the passivation layer includes the same silicon nitride layer as the gapfill layer.

6. The avalanche photo diode of claim 1, wherein the active region and the guard ring region are doped impurities of the same conductivity type.

7. The avalanche photo diode of claim 1, further comprising:
   a top electrode formed on the active region; and
   a bottom electrode disposed on a back side of the substrate and having a portion exposing a light receiving region in the back side of the substrate opposite to the top electrode.

8. The avalanche photo diode of claim 1, further comprising:
   a grading layer formed between the light absorption layer and the clad layer; and
   a buffer layer formed between the grading layer and the clad layer.

9. The avalanche photo diode of claim 8, wherein the substrate, the buffer layer, and the clad layer include indium-phosphorus; and
   wherein the grading layer and the light absorption layer include indium-gallium-arsenic-phosphorus.

10. The avalanche photo diode of claim 1, wherein the substrate, the light absorption layer, and the clad layer are doped with impurities of a first conductivity type; and
    wherein the active region and the guard ring region are doped with impurities of a second conductivity type.

11. The avalanche photo diode of claim 1, wherein a center portion of the active region has a thickness greater than that of an edge portion of the active region adjacent to the insulating region.

12. The avalanche photo diode of claim 1, wherein an upper surface of the clad layer includes a first portion disposed between the active region and the trench and a second portion disposed between the trench and the guard ring region, and the first portion is disposed at a level the same as a level at which the second portion is disposed.

13. The avalanche photo diode of claim 1, wherein the insulating region is spaced apart from the guard ring region and the active region, and an upper surface of the insulating region is at the same level with an upper surface of the clad layer.

* * * * *